(12) United States Patent
Kiyohara et al.

(10) Patent No.: US 12,358,187 B2
(45) Date of Patent: Jul. 15, 2025

(54) IMPRINT MOLD, IMPRINT METHOD, AND MANUFACTURING METHOD OF ARTICLE

(71) Applicant: CANON KABUSHIKI KAISHA, Tokyo (JP)

(72) Inventors: Naoki Kiyohara, Tokyo (JP); Yuichiro Oguchi, Tokyo (JP); Toshiki Ito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 17/705,165

(22) Filed: Mar. 25, 2022

(65) Prior Publication Data

US 2022/0212371 A1  Jul. 7, 2022

Related U.S. Application Data

(63) Continuation of application No. PCT/JP2020/034084, filed on Sep. 9, 2020.

(30) Foreign Application Priority Data

Sep. 30, 2019   (JP) ................... 2019-180372

(51) Int. Cl.
G03F 7/00 (2006.01)
B29C 33/42 (2006.01)
B29C 59/02 (2006.01)
H01L 21/027 (2006.01)

(52) U.S. Cl.
CPC ............ B29C 33/424 (2013.01); B29C 59/02 (2013.01); H01L 21/0271 (2013.01)

(58) Field of Classification Search
CPC ............................. G03F 7/0002; B29C 59/00
See application file for complete search history.

(56) References Cited

U.S. PATENT DOCUMENTS

| | | | |
|---|---|---|---|
| 10,175,572 B2 | 1/2019 | Jung | |
| 2019/0086795 A1 | 3/2019 | Jung | |
| 2019/0086798 A1* | 3/2019 | Nagai | ................ H01L 21/0271 |
| 2021/0294208 A1* | 9/2021 | Mitra | ..................... B29C 59/02 |

FOREIGN PATENT DOCUMENTS

| | | |
|---|---|---|
| EP | 2388119 A1 | 11/2011 |
| JP | 2010258326 A | 11/2010 |
| JP | 5257225 B2 | 8/2013 |
| JP | 2015130384 A | 7/2015 |
| JP | 2018056545 A | 4/2018 |
| JP | 2019160926 A | 9/2019 |
| KR | 20190013764 A | 2/2019 |
| TW | 1355998 B | 1/2012 |
| TW | 1633584 B | 8/2018 |

* cited by examiner

*Primary Examiner* — Susan D Leong
*Assistant Examiner* — John W Hatch
(74) *Attorney, Agent, or Firm* — CANON U.S.A., INC. IP DIVISION (57) ABSTRACT

An imprint mold having an imprint surface that comes into contact with a curable composition on a substrate, the imprint mold includes a concavo-convex pattern formed on the imprint surface of the imprint mold, and a first step portion that has a first surface having a depth of 0.5 times or more and 2 times or less a depth of the concavo-convex pattern in an outer peripheral portion of an area where the concavo-convex pattern is formed.

6 Claims, 11 Drawing Sheets

IMPRINT MOLD, IMPRINT METHOD, AND MANUFACTURING METHOD OF ARTICLE

CROSS-REFERENCE TO RELATED APPLICATIONS

This application is a Continuation of International Patent Application No. PCT/JP2020/034084, filed Sep. 9, 2020, which claims the benefit of Japanese Patent Application No. 2019-180372, filed Sep. 30, 2019, both of which are hereby incorporated by reference herein in their entirety.

BACKGROUND OF THE INVENTION

Field of the Invention

The present invention relates to an imprint mold for use in nanoimprint technology, an imprint method, and a manufacturing method of an article.

Background Art

Nanoimprint technology is attracting attention as a method for forming a nano-sized (for example, 1 nm or more and 1000 nm or less) fine pattern (a concavo-convex structure). In photo nanoimprint technology that utilizes light, an imprint mold having a concavo-convex pattern is brought into contact with a curable composition (also referred to as a photocurable composition and an imprint material) applied on a substrate (an imprint process). The curable composition is irradiated with light and cured (a light irradiation process), then the mold is separated from the cured material (a mold release process), and thus a pattern of the cured material is formed on the substrate. Subsequently, the substrate is processed using the pattern of the cured material as a mask, and a fine pattern is formed on the substrate. A process of forming the pattern of the cured material at a desired position on a wafer together with moving the mold on the wafer is repeated, and thus the pattern of the cured material can be formed over an entire area of the wafer.

A mold for use in the photo nanoimprint technology is generally obtained by forming quartz glass. More specifically, a convex-shaped mesa portion is formed on quartz glass, and a fine concavo-convex pattern is formed on an upper surface (an imprint surface) of the mesa portion. The concavo-convex pattern is a portion to be pressed against a curable composition.

Figure 1A:
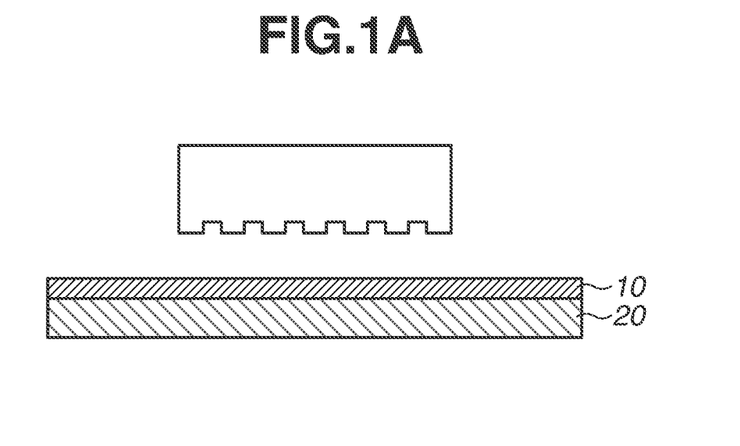
FIG. 1A illustrates an issue that is addressed by the present invention.
Figure 1B:
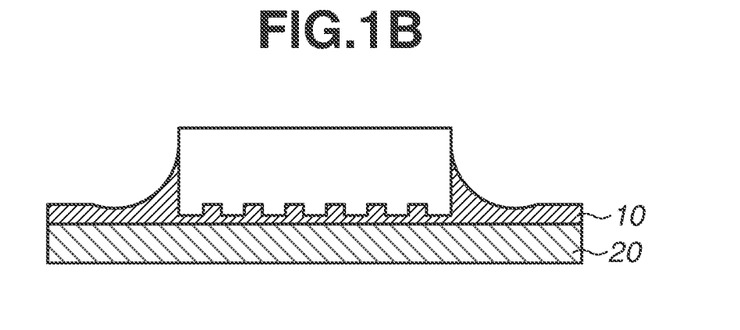
FIG. 1B illustrates an issue that is addressed by the present invention.

In a case where the curable composition is applied using a spin coating method, the curable composition has fluidity at a time of being pressed with the upper surface of the mesa portion of the mold (an imprint process). Accordingly, the curable composition may rise up on a sidewall of the mesa portion due to surface tension (FIG. 1B). Hereinbelow, this phenomenon is referred to as "rising".

The mold is separated from the curable composition on the wafer at a stage in which the curable composition is cured.

However, according to United States Patent Application Publication No. 2019/086795, a curable composition that has rose up on a sidewall of a mesa portion may remain attached on the sidewall or may peel off from the sidewall and form an unintended convex structure larger than a height of an imprint pattern. Accordingly, a subsequent process may be adversely affected.

It is therefore required to suppress rising of the curable composition to about a height of the concavo-convex pattern on the imprint surface or less.

United States Patent Application Publication No. 2019/086795 discusses a method for suppressing rising by exposing an outside of an imprint surface with light to cure the curable composition before imprinting the mold.

CITATION LIST

Patent Literature

PTL 1: United States Patent Application Publication No. 2019/086795
PTL 2: U.S. Pat. No. 10,175,572
PTL 3: Japanese Patent Laid-Open No. 2018-56545

As a method for suppressing rising as described above, a method for exposing and curing a periphery of an imprint surface with light before imprinting is discussed in U.S. Pat. No. 10,175,572 and Japanese Patent Application Laid-Open No. 2018-56545.

With these methods, there is concern about adverse effects of leaking light and scattering light on a pattern area and an adjacent shot.

The present invention is directed to providing a mold structure and an imprint process for suppressing a phenomenon where a curable composition rises up on a side surface in a periphery of an imprint surface of a mold.

SUMMARY OF THE INVENTION

According to an aspect of the present invention, an imprint mold having an imprint surface that comes into contact with a curable composition on a substrate, the imprint mold includes a concavo-convex pattern formed on the imprint surface of the imprint mold, and a first step portion that has a first surface having a depth of 0.5 times or more and 2 times or less a depth of the concavo-convex pattern in an outer peripheral portion of an area where the concavo-convex pattern is formed.

Further features of the present invention will become apparent from the following description of exemplary embodiments with reference to the attached drawings.

DESCRIPTION OF THE EMBODIMENTS

Exemplary embodiments according to the present invention will be described in detail below with reference to the attached drawings as appropriate. However, the present invention is not limited to the exemplary embodiments described below. Further, according to the present invention, the scope of the present invention also includes those to which the exemplary embodiments described below are appropriately modified, improved, and the like based on the ordinary knowledge of a person skilled in the art without departing from the spirit of the present invention.

<Shape of Mold>

As an example of a mold for use in nanoimprint according to the present exemplary embodiment, the mold is formed into a shape in which an imprint surface on the mold protrudes from a mold base material so that the mold base material other than the imprint surface does not come into contact with a substrate to be processed, even in a case where parallelism is not perfect between the mold and the substrate to be processed (a wafer). A convex portion in which the above-described imprint surface is formed is referred to as a mesa portion. Accordingly, the mold other than the imprint surface and the substrate to be processed can secure a certain clearance between each other and prevent from coming into contact with each other at the time of imprinting. A mold of which entire surface of a mold base material is a mesa portion can also be used in the present invention.

Figure 2:
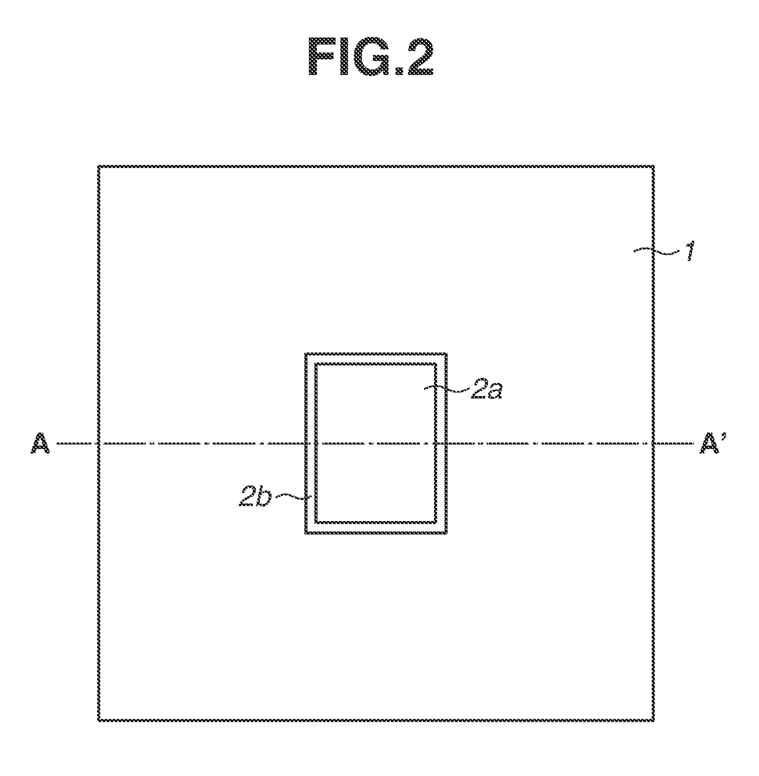
FIG. 2 is a bottom view of an imprint mold according to an exemplary embodiment of the present invention.
Figure 3:
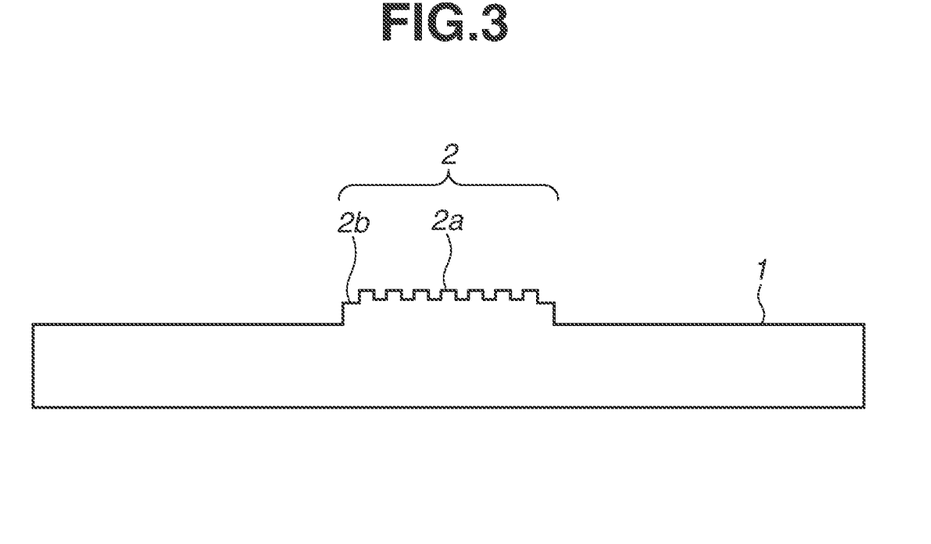
FIG. 3 is a cross-sectional view of the imprint mold according to the exemplary embodiment of the present invention.

FIG. 2 is a bottom view of a representative imprint mold according to the present exemplary embodiment, and FIG. 3 is a cross-sectional view along an A-A' line in FIG. 2. A shape of the mold according to the present exemplary embodiment is described below with reference to FIG. 3.

According to the present exemplary embodiment, a first step portion (2b in FIG. 3) having a first surface and an imprint surface (2a in FIG. 3) are formed on a mesa portion (2 in FIG. 3) protruding from a mold base material surface. It is desirable that a height of the mesa portion is 0.5 μm to 1000 μm. If the height is less than 0.5 μm, an area other than the mesa portion of the mold may come into contact with the substrate to be processed due to deformation of the mold and unevenness of the substrate to be processed, and if the height is more than 1000 μm, there may arise an issue that processing for forming the mesa portion to the mold takes time.

A fine concavo-convex pattern is formed on the imprint surface (2a in FIG. 3). According to the present invention, it is desirable that a depth of the fine concavo-convex pattern is 4 nm or more and 200 nm or less. As a pattern height is lower, a force to peel the mold from a photocurable film of a curable composition namely a mold release force is lower in a mold release process, and the number of mold release defects in which a curable composition pattern is torn off and remains on a mask side in the mold release is smaller. There is a case that adjacent curable composition patterns come into contact with each other by elastic deformation of the curable composition pattern caused by an impact at the time of peeling off the mold, and cured material patterns may adhere to each other or be damaged, but in a case where the pattern height is about 2 times or less with respect to a pattern width (an aspect ratio of 2 or less), there is a high possibility that these issues can be avoided.

On the other hand, if the pattern height is too low, processing accuracy of the substrate to be processed is low.

Figure 6A:
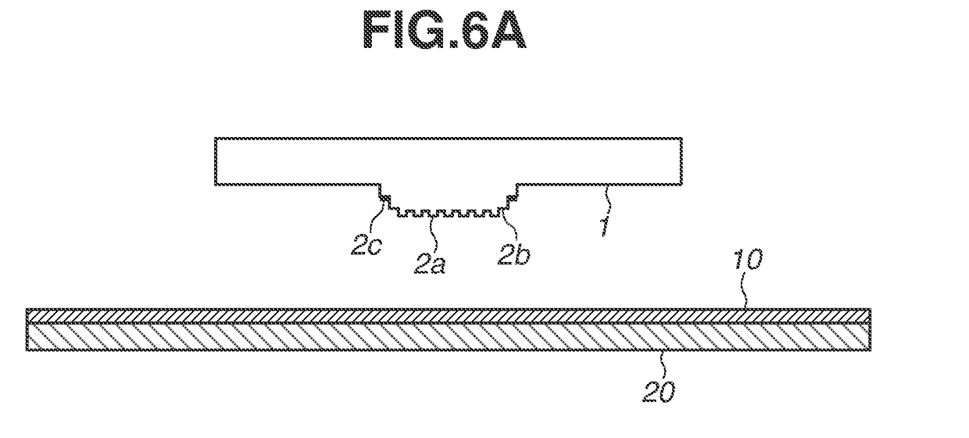
FIG. 6A illustrates an effect of the present invention.
Figure 6B:
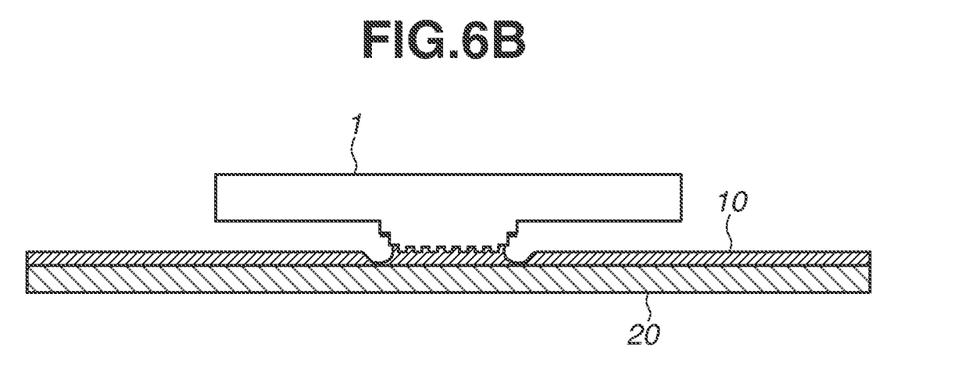
FIG. 6B illustrates an effect of the present invention.

A depth of the first surface (2b in FIG. 3) of the first step portion (i.e., a step height with respect to the imprint surface (2a in FIG. 3)) is desirably 0.5 times or more and 2 times or less, is more desirably 0.75 times or more and 1.5 times or less, and is particularly desirably 0.75 times or more and 1 time or less a depth of the concavo-convex pattern. Under a desirable condition, as illustrated in FIG. 6B, when the mold comes into contact with the curable composition at the time of imprinting, surface tension of the curable composition generated at a surface of the curable composition formed between the mold and the curable composition draws in a surrounding curable composition, and thus a thickness of a surrounding curable composition film is thinned as much as possible. Then, a flow resistance in the thinned area increases, an inflow amount of the curable composition is reduced, and thus rising can be suppressed. If the depth of the first surface is less than half the depth of the concavo-convex pattern, when the mold comes into contact with the curable composition in imprinting, the surface tension of the curable composition generated at the surface of the curable composition formed between the mold and the curable composition draws in the surrounding curable composition, and the curable composition fills even an outside of the first step portion. Then, curvature of the surface is reduced, an effect of thinning the thickness of the surrounding curable composition film is weakened, and the rising is developed. There may also be a case that the outside of the first step portion comes into contact with the curable composition film, and the rising is developed. On the other hand, if the depth of the first surface is 2 times or more, in a pattern which is finished by being cured and released from the mold after the filling in the first step portion, a height of the pattern formed in an area of the first step portion becomes higher than a height of the concavo-convex pattern on the imprint surface with respect to a substrate surface, and inconvenience occurs in a subsequent process. An outer peripheral width of the first surface in the first step portion is desirably 3 times or more and 100 times or less a curable composition film thickness, or 5 times or more and 200 times or less the pattern depth, and is more desirably 5 times or more and 50 times or less the curable composition film thickness, or 5 times or more and 100 times or less the pattern depth. If the outer peripheral width of the first step portion is 3 times the curable composition film thickness or 5 times or less the pattern depth, the surface of the curable composition reaches an edge portion of the first step portion, and the rising develops along an outer peripheral side surface of the first step portion. If the outer peripheral width of the first step portion is 100 times the curable composition film thickness or 200 times or more the pattern depth, an outer peripheral portion of the mold bends in a substrate direction at the same time by receiving a pressure from the surface, the outer peripheral side surface of the first step portion comes into contact with the curable composition film, and the rising occurs. It is desirable that the first step portion is formed in an area of 80% or more, more desirably 90% or more, and particularly in an entire area of an imprint surface outer peripheral portion. If the formation ratio of the first step portion is small in the imprint surface outer peripheral portion, an issue that the rising occurs in a portion where the first step portion is not formed arises.

Regarding a size of each shape of an imprint mold, for example, the depth of the first surface from the imprint surface may be 2 nm or more and 400 nm or less, and a height of a surface of a side wall which is in contact with the first surface and extends from the imprint surface in a depth direction from the first surface may be 600 nm or more.

According to the PTL 1, a mold configuration including a step portion is described. The PTL 1 is characterized in that a light shielding film of chromium (Cr) or the like is formed on the step portion. If the light shielding film is formed on the first step portion as in the exemplary embodiment, there arises an issue that a curable composition directly under the first step portion remains on a substrate or a mold without being cured in a light irradiation process, and an uncured curable composition contaminates the cured material pattern on the substrate and the mold. According to the present exemplary embodiment, the first step portion can remain transparent with respect to irradiation light, and thus the above-described issue of an uncured curable composition does not occur.

Further, in the PTL 1, the first step portion does not come into contact with the curable composition.

In other words, in terms of another aspect of the imprint mold according to the present exemplary embodiment, it can be also said that the imprint mold is characterized in that the imprint mold has a staircase structure including a step in a direction in which an outer peripheral portion of the imprint surface separates from the substrate, and when the curable composition is brought into contact with the imprint surface, the surface of the curable composition is formed on a tread of the staircase structure (the first surface of the first step portion) in the outer peripheral portion.

Figure 4:
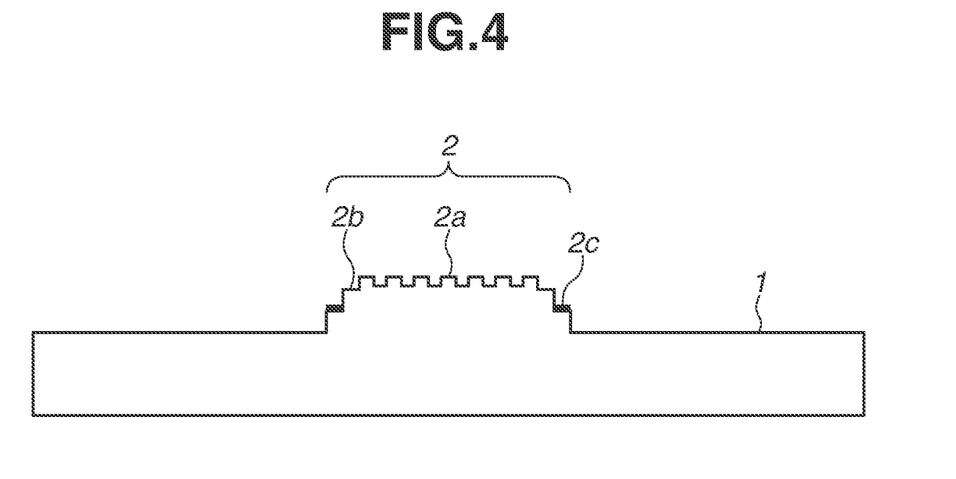
FIG. 4 is a cross-sectional view of the imprint mold according to the exemplary embodiment of the present invention.

Further, a second step portion 2c in FIG. 4 can also be formed on the imprint mold of the present invention. In photo imprint, it is desirable to form a light shielding film of chromium (Cr) or the like on a surface of the second step portion.

The imprint surface (2a in FIG. 3) of the mold may have been subjected to surface treatment in order to improve a peeling property between a photo-cured curable composition and the imprint surface (2a in FIG. 3). Examples of methods for surface treatment include a method for forming a mold release agent layer by applying a mold release agent to a surface of the imprint surface (2a in FIG. 3). Here, the mold release agent to be applied to the surface of the imprint surface (2a in FIG. 3) includes a silicon-based mold release agent, a fluorine-based mold release agent, a hydrocarbon-based mold release agent, a polyethylene-based mold release agent, a polypropylene-based mold release agent, a paraffin-based mold release agent, a montan-based mold release agent, and a carnauba-based mold release agent. For example, a commercially available coating type mold release agent, such as Optool (registered trademark) DSX manufactured by Daikin Industries, Ltd., can also be suitably used. One type of the mold release agent may be used singly, or two or more types thereof may be used in combination. Among these mold release agents, fluorine-based and hydrocarbon-based mold release agents are particularly desirable.

<Material of Mold>

In a nanoimprint method, a mold (104) made of a light transmissive material is used as the mold (104) in consideration of the light irradiation process. As a material of the mold (104), specifically, it is desirable to use glass, quartz, polymethylmethacrylate (PMMA), an optically transparent resin, such as a polycarbonate resin, a transparent metal vapor deposition film, a flexible film of polydimethylsiloxane or the like, a photocurable film, and a metal film. However, in a case where an optically transparent resin is used as a material of the mold (104), it is necessary to select a resin that does not dissolve in a component included in the curable composition. Quartz is particularly desirable for a material of the mold (104) because of its low thermal expansion coefficient and low pattern distortion.

<Imprint Method>

Next, each process in an imprint method according to the present exemplary embodiment is described with reference to schematic cross-sectional views in FIG. 5.

It is desirable that a cured film of the curable composition obtained by the imprint method according to the present exemplary embodiment is a film having a pattern with a size of 1 nm or more and 10 mm or less. Further, it is more desirable that a film has a pattern with a size of 10 nm or more and 100 µm or less. Generally, a pattern forming technique for producing a film having a nano-sized (1 nm or more and 1000 nm or less) pattern (a concavo-convex structure) using light is referred to as a nanoimprint method. The imprint method according to the present exemplary embodiment is the nanoimprint method. Each process is described below.

(Lamination Process [1])

Figure 5:
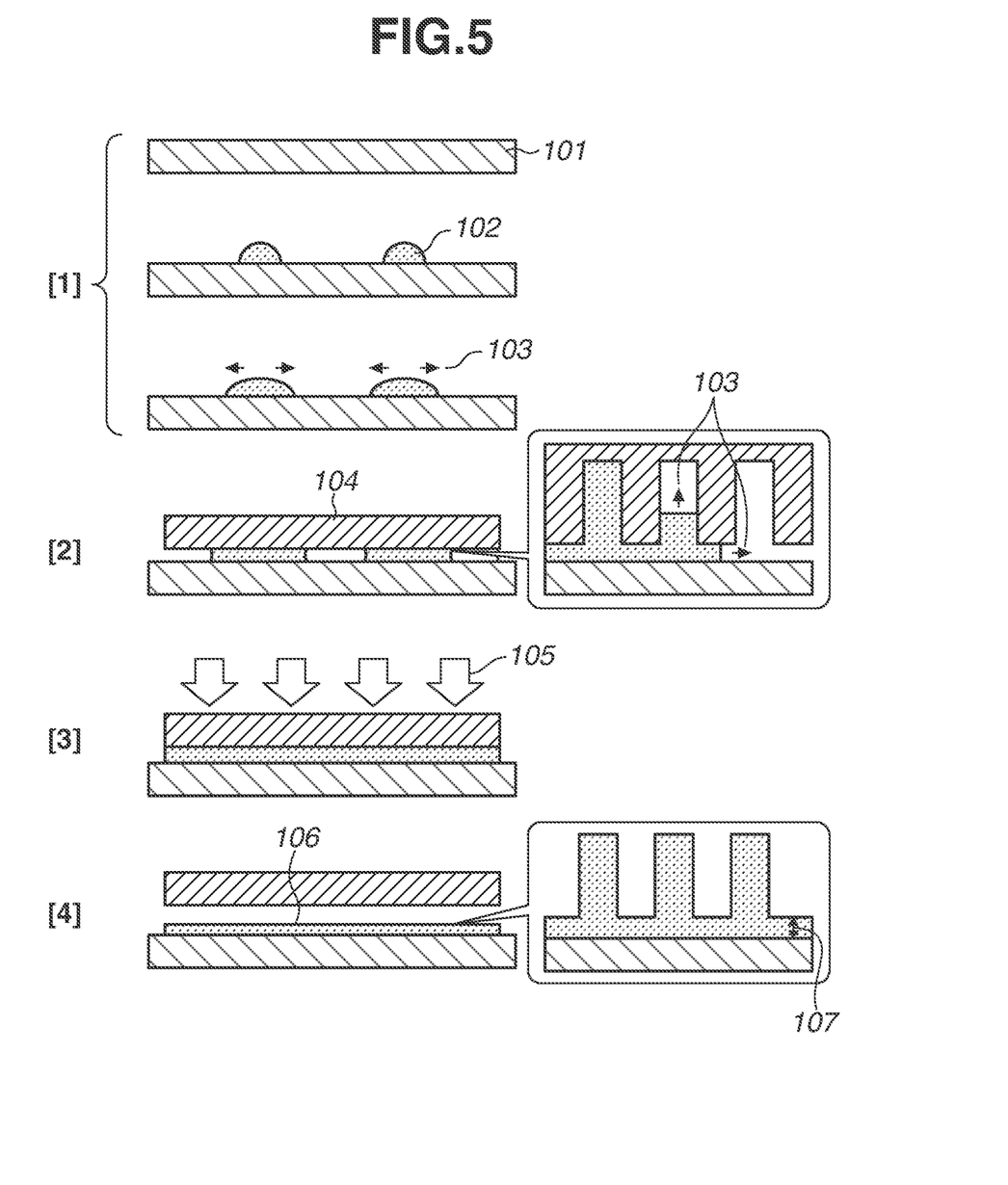
FIG. 5 illustrates an imprint method according to the exemplary embodiment of the present invention.

In the present process (a lamination process [1]), a curable composition 102 (an imprint material) is applied to a substrate 101 as illustrated in FIG. 5. Examples of application methods include an ink jet method, a dip coating method, an air knife coating method, a curtain coating method, a wire bar coating method, a gravure coating method, an extrusion coating method, a slit scan method, a spin coating method, and the like can be used. The spin coating method is particularly desirable from viewpoints of ease of application with a predetermined film thickness, productivity, film thickness uniformity, and the like.

It is desirable that viscosity of a mixture of components of the curable composition according to the present exemplary embodiment excluding a solvent at 23° C. is 1 mPa·s or more and less than 100,000 mPa·s. Further, the viscosity is more desirably 1 mPa·s or more and less than 10, 000 mPa·s, and is particularly desirably 10 mPa·s or more and less than 1, 000 mPa·s. If the viscosity of the curable composition exceeds 100, 000 mPa·s, filling into the fine concavo-convex pattern described below is slow. Further, if the viscosity is lower than 1 mPa·s, application unevenness may occur due to flowing at the time of application of the composition, and it is not desirable.

With regard to the surface tension of the curable composition according to the present exemplary embodiment, it is desirable that the surface tension of the composition of components excluding the solvent at 23° C. is 5 mN/m or more and 70 mN/m or less. The surface tension is more desirably 7 mN/m or more and 50 mN/m or less, and is further desirably 10 mN/m or more and 40 mN/m or less. As the surface tension is higher, for example, is 5 mN/m or more, a capillary force acts strongly, and filling into the fine concavo-convex pattern is completed in a short time at the time when the curable composition is brought into contact with the mold. Further, if the surface tension is 70 mN/m or less, a cured film to be obtained by curing the curable composition is a cured film having surface smoothness.

A contact angle of the curable composition according to the present exemplary embodiment with respect to the imprint surface and the substrate surface is desirably 0° or more and 90° or less for the composition of the components excluding the solvent. If the contact angle is larger than 90°, the capillary force acts in a negative direction (a direction to shrink a contact interface between the mold and the curable composition) in the inside of the fine concavo-convex pattern on the mold, and filling of the curable composition is not completed. It is particularly desirable that the contact angle is 0° or more and 30° or less. As the contact angle is lower, the capillary force acts stronger, and a filling speed is faster.

The substrate 101 as a target on which the curable composition 102 is provided is the substrate to be processed, and a silicon wafer is usually used. A layer to be processed may be formed on the substrate 101. Another layer may be further formed between the substrate 101 and the layer to be processed. In a case where a quartz substrate is used as the substrate 101, a replica of a quartz imprint mold (a mold replica) can be produced.

However, the substrate 101 is not limited to a silicon wafer and a quartz substrate. The substrate 101 can also be arbitrarily selected from aluminum, a titanium-tungsten alloy, an aluminum-silicon alloy, an aluminum-copper-silicon alloy, silicon oxide, and silicon nitride, which are known as substrates for semiconductor devices.

The surface of the substrate 101 (the substrate to be processed) to be used or of the layer to be processed may have been subjected to surface treatment, such as silane coupling treatment, silazane treatment, and forming of an organic thin film, to improve adhesiveness to the curable composition.

(Imprint Process [2])

Next, as illustrated in [2], [3], and [4] of FIG. 5, the mold (104) having an original fine concavo-convex pattern for transferring a pattern shape is brought into contact with the curable composition formed in the previous process (the lamination process [1]). Accordingly, the curable composition fills a concave portion of the fine concavo-convex pattern on the surface of the mold (104) and forms a liquid film filling the fine pattern of the mold.

In the present process (an imprint process), if a distance between the first step portion and the substrate becomes a film thickness of the curable composition or less, the curable composition rises up on the outer peripheral side surface of the first step portion, and thus it is desirable that the distance between the first step portion and the substrate is maintained at the film thickness of the curable composition or more.

In the imprint process, the curable composition is desirable to be brought into contact with a part of the first step portion and is further desirable not to be brought into contact with the outer peripheral portion of the first step portion.

In the imprint process, pressure to be applied to the curable composition is not particularly limited in bringing the mold (104) into contact with the curable composition as illustrated in [2] of FIG. 5. The pressure may be 0 MPa or more and 100 MPa or less. The pressure is desirably 0 MPa or more and 50 MPa or less, is more desirably 0 MPa or more and 30 MPa or less, and is further desirably 0 MPa or more and 20 MPa or less.

In the imprint process, the pressure may be set to negative to the extent that the mold does not come off from the curable composition after the entire imprint surface is in contact.

In the imprint process, a time to bring the mold into contact with the curable composition is not particularly limited, but is desirable to be, for example, 0.01 seconds or more and 600 seconds or less. The time is desirably 0.01 seconds or more and 3 seconds or less, and is particularly desirably 0.1 seconds or more and 1 second or less. If the time is shorter than 0.01 seconds, filling of the curable composition becomes insufficient, and a defect referred to as an unfilled defect tends to occur frequently. From a viewpoint of productivity, the time is desirably 600 seconds or less.

The imprint process can be performed in any of conditions of an air atmosphere, a reduced pressure atmosphere, and an inert gas atmosphere, but the reduced pressure atmosphere and the inert gas atmosphere in which an inert gas is used as an atmosphere control gas are desirable since influence of oxygen and moisture on a curing reaction can be prevented therein. Specific examples of the inert gas that can be used when the present process is performed in the inert gas atmosphere include nitrogen, carbon dioxide, helium, argon, and various chlorofluorocarbon gases, or a mixed gas of these gases. In a case where the present process is performed in an atmosphere of a specific gas including the air atmosphere, a desirable pressure is 0.0001 atmospheric pressure (atm) or more and 10 atm or less.

The imprint process may be performed in an atmosphere including a condensable gas (hereinbelow, referred to as "a condensable gas atmosphere") in which the condensable gas is used as the atmosphere control gas. In the present specification, the condensable gas refers to a gas that condenses and liquefies due to capillary pressure generated during filling when a concave portion of the fine pattern formed on the mold (104) and a gap between the mold and the substrate are filled with the gas in the atmosphere together with the curable composition. The condensable gas exists as the gas in the atmosphere before the curable composition and the mold (104) come into contact with each other ([2] in FIG. 5) in the imprint process.

If the imprint process is performed in the condensable gas atmosphere, the gas filling in the concave portion of the fine pattern is liquefied by the capillary pressure generated by the curable composition, and bubbles disappear, which means that a filling property is excellent. The condensable gas may be dissolved in the curable composition.

A boiling point of the condensable gas is not limited as long as it is an atmospheric temperature of the imprint process or less, but is desirably −10° C. to 23° C. and is further desirably 10° C. to 23° C. Within this range, the filling property is further excellent.

A vapor pressure of the condensable gas at the atmospheric temperature in the imprint process is not limited as long as it is a mold pressure or less at the time of imprinting in the imprint process, but is desirably 0.1 to 0.4 MPa. Within this range, the filling property is further excellent. If the vapor pressure at the atmospheric temperature is more than 0.4 MPa, an effect of eliminating bubbles tends to be insufficient. On the other hand, if the vapor pressure at the atmospheric temperature is less than 0.1 MPa, it is necessary to reduce the pressure, and the apparatus tends to be complicated. The atmospheric temperature in the imprint process is not particularly limited, but is desirably 20° C. to 25° C.

Specific examples of the condensable gas includes chlorofluorocarbon (CFC) such as trichlorofluoromethane, fluorocarbon (FC), hydrochlorofluorocarbon (HCFC), hydrofluorocarbon (HFC) such as 1,1,1,3,3-pentafluoropropane ($CHF_2CH_2CF_3$, HFC-245fa, PFP), and hydrofluoroether (HFE) such as pentafluoroethyl methyl ether ($CF_3CF_2OCH_3$, HFE-245 mc).

Among these fluorocarbons, it is desirable that 1,1,1,3,3-pentafluoropropane (vapor pressure of 0.14 MPa at 23° C. and boiling point of 15° C.), trichlorofluoromethane (vapor pressure of 0.1056 MPa at 23° C. and boiling point of 24°

C.), and pentafluoroethyl methyl ether are used from the viewpoint of excellent filling property at the atmospheric temperature of 20° C. to 25° C. in the imprint process. Further, it is particularly desirable that 1,1,1,3,3-pentafluoropropane is used from the viewpoint of excellent safety.

One type of the condensable gas may be used singly, or two or more types thereof may be used in a mixture. Further, the condensable gases may be mixed with a non-condensable gas, such as air, nitrogen, carbon dioxide, helium, and argon. As the non-condensable gas to be mixed with the condensable gas, helium is desirable from the viewpoint of the filling property. Helium can permeate a mold 205. Thus, in a case where the concave portion of the fine pattern formed on the mold 104 is filled with the gases (the condensable gas and helium) in the atmosphere together with the curable composition in the imprint process, the condensable gas liquefies, and helium permeates the mold.

(Light Irradiation Process [3])

Next, as illustrated in [3] of FIG. 5, the curable composition is irradiated with light (105) via the mold (104). More specifically, the curable composition filling the fine pattern of the mold (104) is irradiated with the light (105) via the mold (104). Accordingly, the curable composition filling the fine pattern of the mold (104) is cured by the irradiated light (105) and becomes a cured film (106) having the pattern shape.

The irradiation light (105) to the curable composition filling the fine pattern of the mold (104) is selected based on a sensitive wavelength of the curable composition. Specifically, it is desirable to appropriately select and use ultraviolet light having wavelength of 150 nm or more and 400 nm or less, an X ray, an electron beam, or the like.

Among these light, ultraviolet light is particularly desirable for the irradiation light (105). This is because many of commercially available curing aids (a photopolymerization initiator) are compounds sensitive to ultraviolet light. A light source which emits ultraviolet light includes, for example, a light-emitting diode (LED), a high pressure mercury lamp, an ultra high pressure mercury lamp, a low pressure mercury lamp, a deep-ultraviolet (UV) lamp, a carbon arc lamp, a chemical lamp, a metal halide lamp, a xenon lamp, a krypton fluoride (KrF) excimer laser, an argon fluoride (ArF) excimer laser, and a molecular fluorine ($F_2$) excimer laser, among which the ultra high pressure mercury lamp is particularly desirable. The number of light sources to be used may be one or more. Further, when light irradiation is performed, the entire surface of the curable composition filling the fine pattern of the mold may be irradiated with the light or only a part of the area may be irradiated with the light.

The light irradiation process may be performed intermittently a plurality of times on the entire area on the substrate or continuously on the entire area. Further, a partial area A may be irradiated with the light in a first irradiation process, and an area B different from the area A may be irradiated with the light in a second irradiation process.

(Mold Release Process [4])

Next, the cured film (106) having the pattern shape and the mold (104) are separated from each other. In the present process (a mold release process) illustrated in [4] of FIG. 5, the cured film (106) having the pattern shape and the mold (104) are separated from each other, and the cured film (106) having the pattern shape which is a reverse pattern of the fine pattern formed on the mold (104) in the process [3] (the light irradiation process) is obtained in a self-standing state. The cured film (106) having the pattern shape also has a cured film remaining in the concave portion of the concavo-convex pattern, and the remaining film is referred to as a residual film (107).

In a case where the imprint process is performed in the condensable gas atmosphere, the condensable gas evaporates as the pressure at the interface at which the cured film (106) and the mold (104) are in contact with each other is reduced at the time when the cured film (106) and the mold (104) are separated from each other in the mold release process. The evaporation tends to have an effect of reducing a mold release force which is a force required to separate the cured film (106) and the mold (104).

A method for separating the cured film (106) having the pattern shape from the mold (104) is not particularly limited as long as a part of the cured film (106) having the pattern shape is not physically damaged at the time of separation, and various conditions and the like are also not particularly limited. For example, the substrate (101) (the substrate to be processed) may be fixed, and the mold (104) may be moved away from the substrate (101) to be peeled off. Alternatively, the mold (104) may be fixed, and the substrate (101) may be moved away from the mold (104) to be peeled off. Alternatively, both of these may be pulled in opposite directions to be peeled off.

A process (a manufacturing process) implemented by continuously performing the above-described processes [1] to [4] on a plurality of shot areas is performed, and thus a cured film can be obtained which has a desired concavo-convex pattern shape (a pattern shape based on a concavo-convex shape of the mold 104) at a desired position on a substrate.

According to the present exemplary embodiment, the step portion is provided in a periphery of the imprint surface, whereby the curable composition existing in the outer peripheral portion of the step portion is drawn into a gap between the step portion and the substrate by the surface tension generated on the surface of the curable composition formed between the surface of the step portion and the substrate, and thus the curable composition at the outer peripheral portion is thinned. Accordingly, a flow resistance at the time of inflow is increased, and an inflow of the curable composition to the outer peripheral portion is suppressed. As a result, the rising can be suppressed.

<Exemplary Embodiment of Manufacturing Method of Article>

A manufacturing method of an article according to the exemplary embodiment of the present invention is suitable for manufacturing an article, for example, a micro device, such as a semiconductor device, and an element having a fine structure. The manufacturing method of an article according to the present exemplary embodiment includes a process for forming a pattern on an imprint material supplied (applied) to a substrate by using an imprint apparatus (an imprint method) described above and a process for processing the substrate on which the pattern is formed by the process. Further, the manufacturing method includes other known processes (oxidation, film formation, vapor deposition, doping, flattening, etching, resist stripping, dicing, bonding, packaging, and the like). The manufacturing method of an article according to the present exemplary is advantageous in at least one of a performance, quality, productivity, and a production cost of the article compared with a conventional method.

The pattern of the cured material formed by using the imprint apparatus is used permanently in at least a part of various articles or used temporarily in manufacturing various article. The article includes an electrical circuit element, an optical element, a microelectromechanical system (MEMS), a recording element, a sensor, or a mold. The electrical circuit element includes a volatile or nonvolatile semiconductor memory, such as a dynamic random access memory (DRAM), a static RAM (SRAM), a flash memory, and a magnetic RAM (MRAM), and a semiconductor element, such as a large-scale integration (LSI), a charged coupled device (CCD), an image sensor, and a field-programmable gate array (FPGA). The mold includes an imprint mold.

The pattern of the cured material is used as it is as at least a part of a structural member of the above-described article or is temporarily used as a resist mask. The resist mask is removed after etching, ion implantation, or the like is performed in a processing process of the substrate.

Figure 7A:
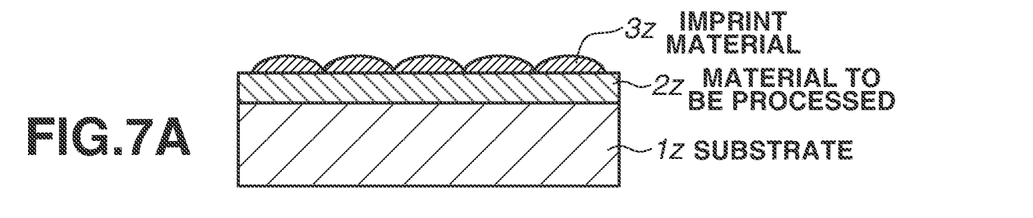
FIG. 7A is a diagram illustrating a manufacturing method of an article.

Next, a specific manufacturing method of an article is described. As illustrated in FIG. 7A, a substrate 1z, such as a silicon wafer, on which a material to be processed 2z, such as an insulating material, is formed on a surface is prepared, and subsequently, an imprint material 3z is applied to the surface of the material to be processed 2z using an ink jet method or the like. FIG. 7A illustrates a state in which the imprint material 3z is applied in a form of a plurality of droplets to the substrate.

Figure 7B:
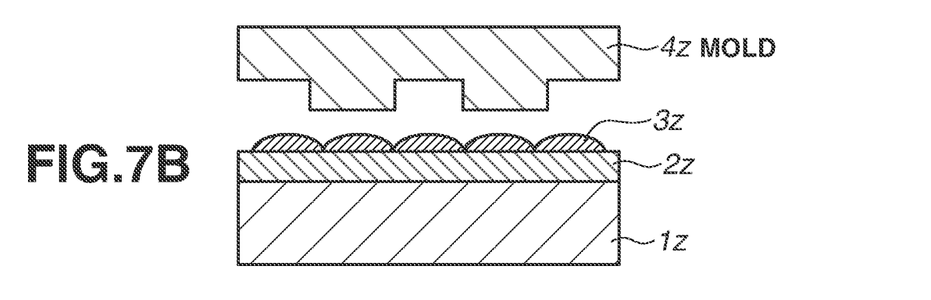
FIG. 7B is a diagram illustrating the manufacturing method of an article.
Figure 7C:
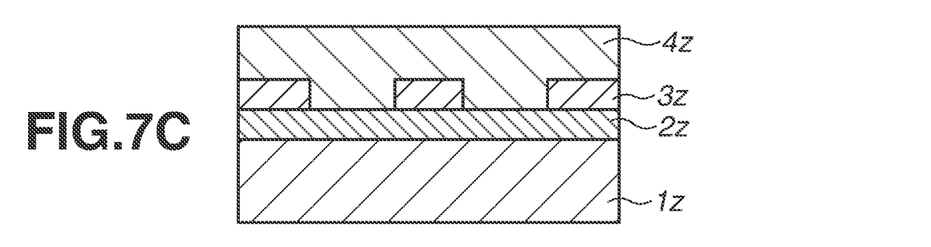
FIG. 7C is a diagram illustrating the manufacturing method of an article.

As illustrated in FIG. 7B, a mold 4z for imprinting is faced to the imprint material 3z so that a side of the mold 4z having a concavo-convex pattern is directed to the imprint material 3z on the substrate. As illustrated in FIG. 7C, the substrate 1z to which the imprint material 3z is applied is brought into contact with the mold 4z, and pressure is applied thereto. The imprint material 3z fills in a gap between the mold 4z and the material to be processed 2z. When the imprint material 3z is irradiated with light as energy for curing through the mold 4z in this state, the imprint material 3z is cured.

Figure 7D:
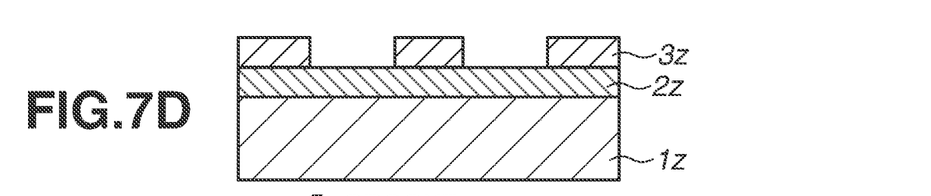
FIG. 7D is a diagram illustrating the manufacturing method of an article.

As illustrated in FIG. 7D, when the mold 4z is separated from the substrate 1z after the imprint material 3z is cured, the pattern of the cured material of the imprint material 3z is formed on the substrate 1z. The pattern of the cured material has a shape in which the concave portion of the mold corresponds to the convex portion of the cured material, and the convex portion of the mold corresponds to the concave portion of the cured material, in other words, the concavo-convex pattern of the mold 4z is transferred to the imprint material 3z.

Figure 7E:
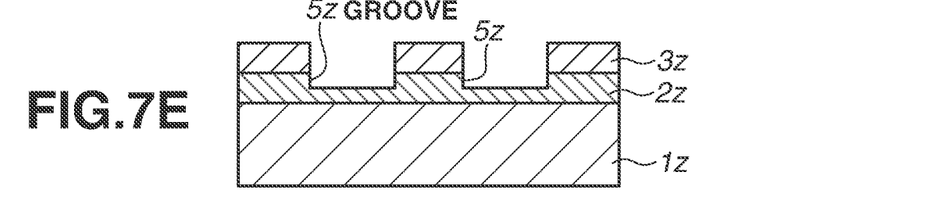
FIG. 7E is a diagram illustrating the manufacturing method of an article.
Figure 7F:
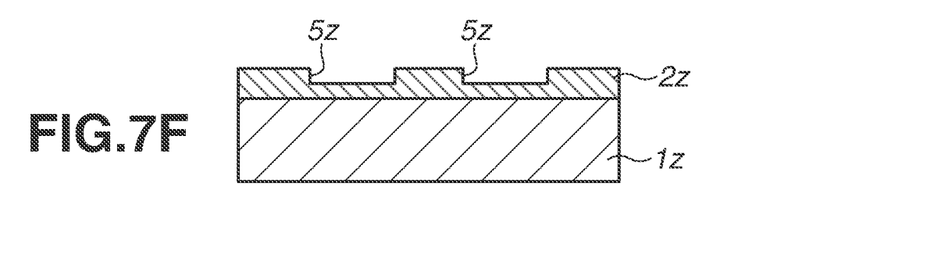
FIG. 7F is a diagram illustrating the manufacturing method of an article.

As illustrated in FIG. 7E, when etching is performed using the pattern of the cured material as an etching resistant mask, a portion where the cured material does not exist or thinly remains on a surface of the material to be processed 2z is removed and a groove 5z is formed. As illustrated in FIG. 7F, when the pattern of the cured material is removed, the article in which the groove 5z is formed on the surface of the material to be processed 2z can be obtained. While the pattern of the cured material is removed here, the pattern of the cured material may be used, for example, as a film for interlayer insulation included in a semiconductor element and the like, namely a structural member of the article without being removed after the processing.

Hereinbelow, a more detailed description will be given with reference to an example.

EXAMPLE

<Simulation of Rising Behavior>

Figure 8:
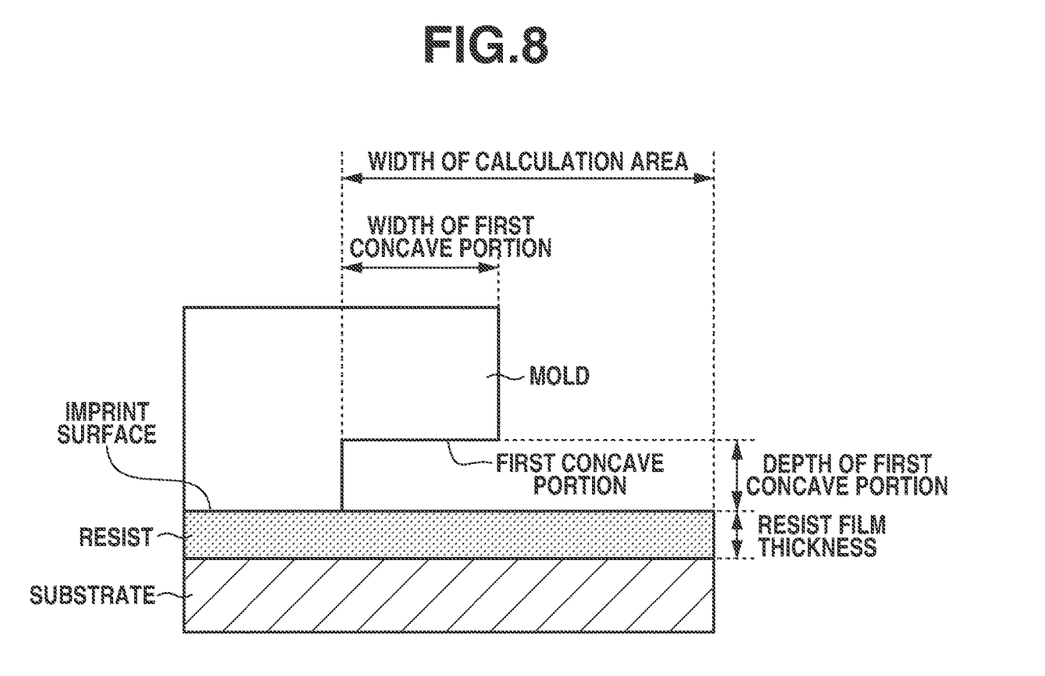
FIG. 8 illustrates a simulation model.

As illustrated in FIG. 8, a simulation was performed using a cross section perpendicular to an imprint surface as a two-dimensional model. The curable composition was an incompressible Newtonian fluid which has viscosity of 0.5 Pa·s, surface tension of 0.03 N/m, a contact angle with the mold of 0 degrees, a contact angle with the substrate of 0 degrees, and a film thickness of 100 nm on the substrate, and the mold and the substrate were each rigid body and not movable.

Since the curable composition in an area between the imprint surface and the substrate hardly flows, a calculation area was limited to an outer peripheral side from a boundary portion between the imprint surface and the first step portion. A width of the calculation area was set to 10 μm that is sufficiently long with consideration given to an inflow from the liquid film of the curable composition widely existing in an outer peripheral area. An initial condition was a moment when the imprint surface and a thin film of the curable composition came into contact with each other. Hereinbelow, a height of the rising is defined as a height obtained by subtracting a height of the first step portion (160 nm) relative to the substrate from a maximum height at which the curable composition exists relative to the substrate. According to a first comparative example, there is no first step portion, but the height of the rising is similarly defined as a height obtained by subtracting 160 nm from the maximum height at which the curable composition exists relative to the substrate.

First Example

Figure 9:
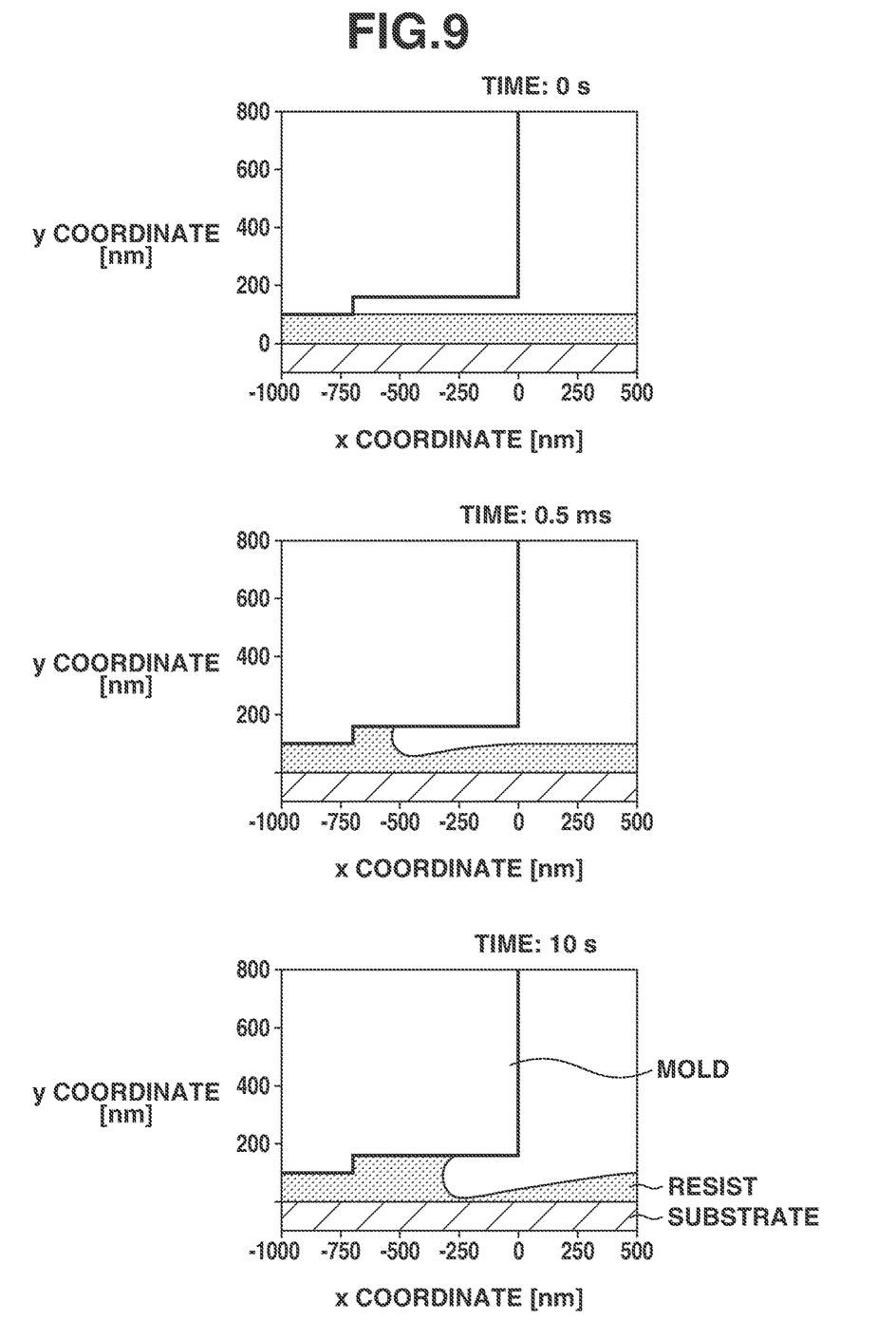
FIG. 9 illustrates an imprint simulation result of a first example of the present invention.

FIG. 9 illustrates results of time evolution calculation performed under conditions that a width and a depth of the first step portion where 700 nm and 60 nm, respectively. As a result that a pressure of the curable composition near the interface was lowered by the surface tension and the surrounding curable composition was drawn in, the film thickness of the curable composition slightly outside the interface became extremely thin, whereby a flow of the curable composition is suppressed. Eventually, an increase of the interface stopped in the area of the first step portion, and it was confirmed that the rising did not occur after 10 seconds. Filling into the fine concavo-convex pattern was completed within 3 seconds.

First Comparative Example

Figure 10:
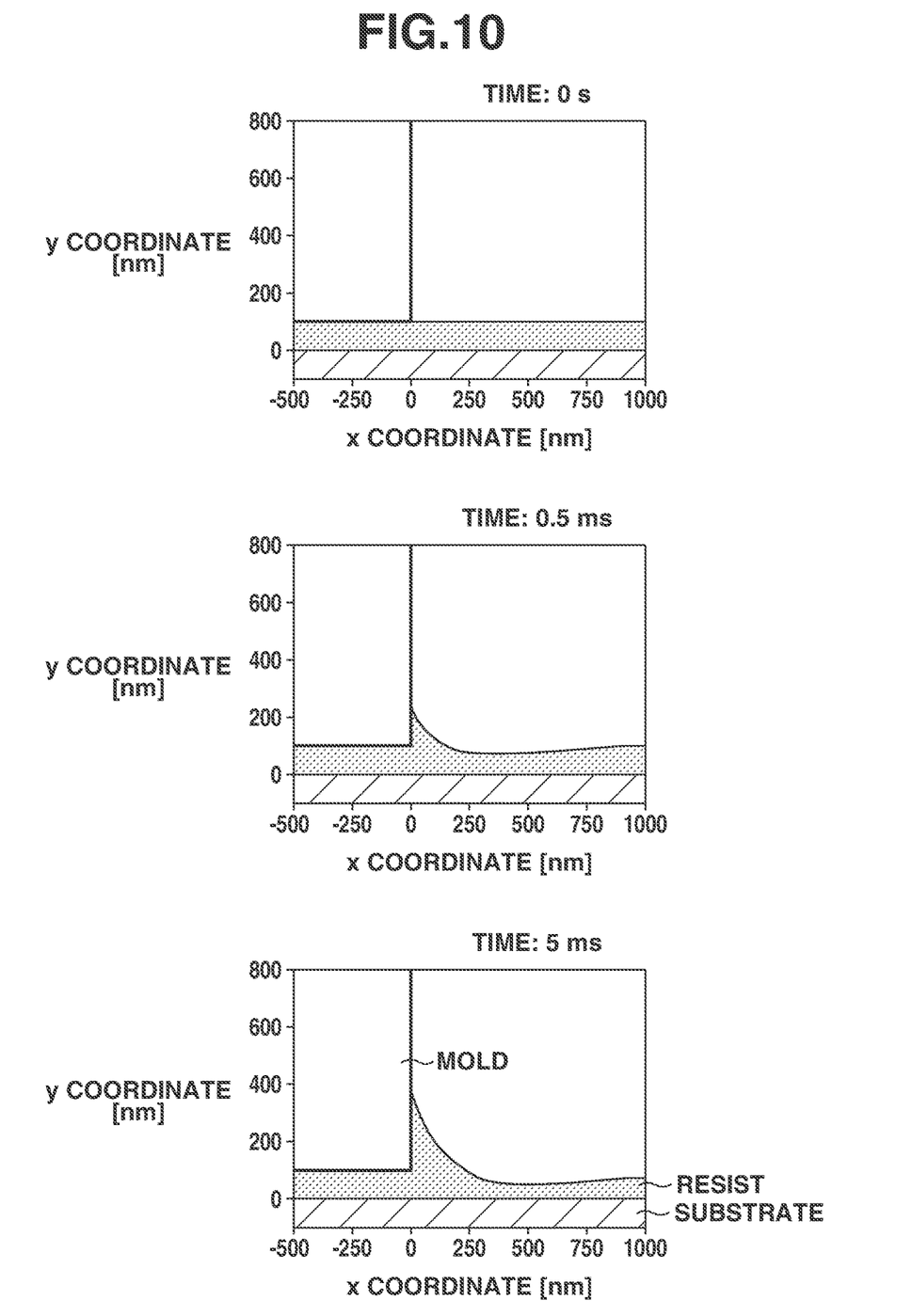
FIG. 10 illustrates an imprint simulation result of a first comparative example of the present invention.

FIG. 10 illustrates results of time evolution calculation performed under the same simulation conditions as those in the first example and a condition that there was no first step portion (a width of the first step portion was 0 nm). It was confirmed that the rising occurred immediately, and the height of the rising reached about 300 nm at 5 ms that was long before the filling was completed.

Second Comparative Example

Figure 11:
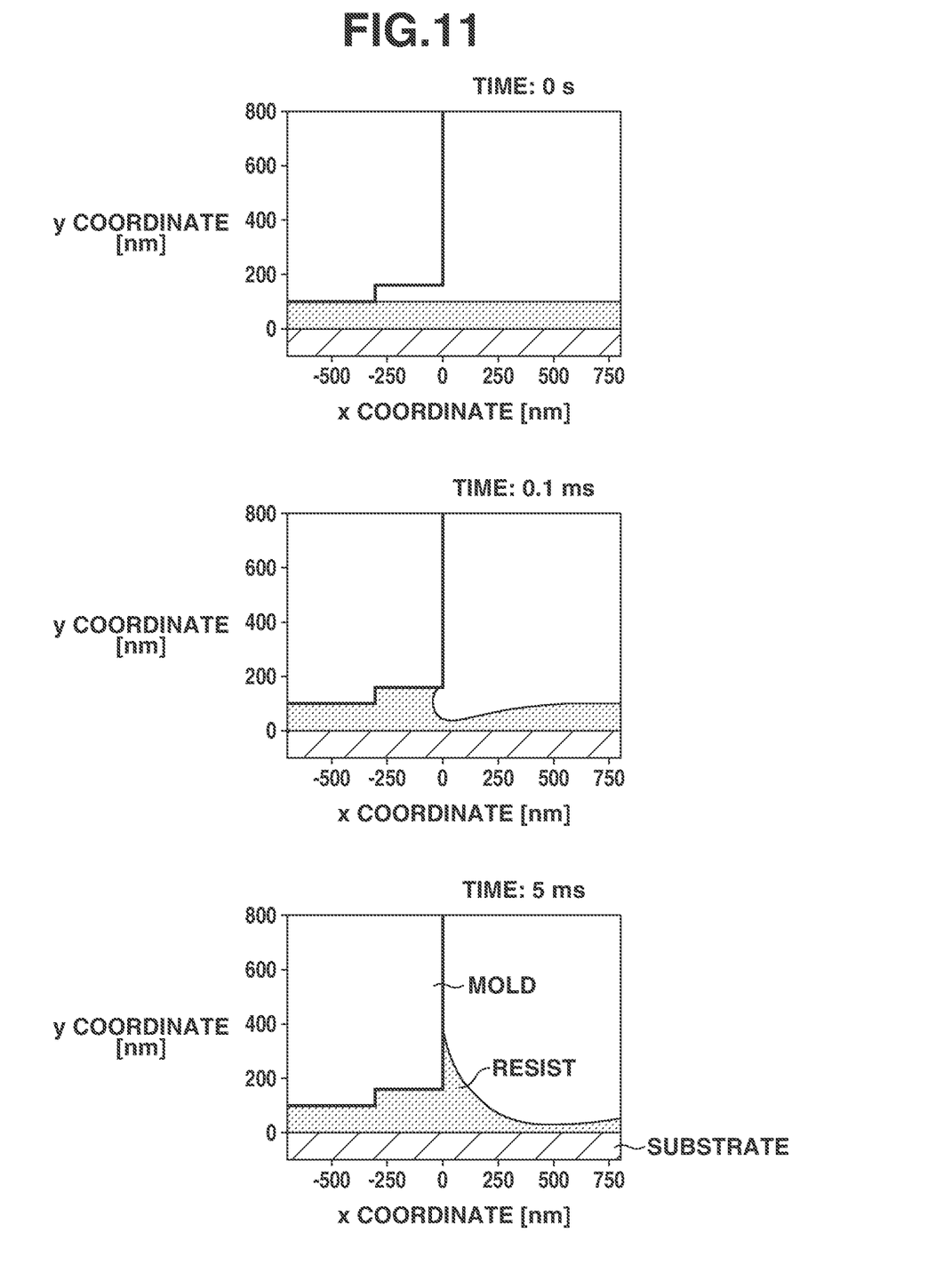
FIG. 11 illustrates an imprint simulation result of a second comparative example of the present invention.

FIG. 11 illustrates results of time evolution calculation performed under the same simulation conditions as those in the first example and conditions that the width and the depth of the first step portion where 300 nm and 60 nm, respectively. The obtained result shows that the curable composition reached the outer peripheral side of the first step portion after 0.1 ms and climbed up the side surface moment by moment after curvature of the surface of the curable composition decreased. The result indicates that the rising of about 150 nm occurred after 5 ms that was long before the filling to the fine concavo-convex pattern was completed.

From the above-described simulations, it is indicated that the rising is suppressed by the first step portion according to the exemplary embodiment of the present invention.

The present invention is not limited to the above-described exemplary embodiments, and various modifications and variations can be made without departing from the spirit and the scope of the present invention. Therefore, the following claims are attached in order to publicize the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprint mold having an imprint surface that comes into contact with a curable composition on a substrate, the imprint mold comprising:
   a concavo-convex pattern formed on the imprint surface of the imprint mold, and
   a first step portion that has a first surface having a depth greater than a depth of the concavo-convex pattern and 2 times or less the depth of the concavo-convex pattern,
   wherein the first step portion is disposed adjacent to an outer peripheral portion of the imprint surface such that the first surface surrounds the imprint surface, and
   wherein the first surface of the first step portion has a region that comes into contact with the curable composition in a case where the curable composition is brought into contact with the imprint surface.

2. The imprint mold according to claim 1, wherein the first step portion is formed in an area of 80% or more in the outer peripheral portion of the imprint surface.

3. The imprint mold according to claim 1, wherein an outer peripheral width of the first surface is 5 times or more and 100 times or less the depth of the concavo-convex pattern.

4. The imprint mold according to claim 1, further comprising
   a second step portion having a second surface on an outer periphery of the first surface,
   wherein a light shielding film is formed on the second step portion, and a surface of the light shielding film is arranged at a position deeper than a depth of the first surface from the imprint surface.

5. The imprint mold according to claim 1, wherein the imprint mold includes a mesa portion protruding from a base material surface, and at least the imprint surface and the first step portion are arranged on the mesa portion.

6. The imprint mold according to claim 1, wherein a depth of the first surface from the imprint surface is 2 nm or more and 400 nm or less, and a height of a surface of a side wall which is in contact with the first surface and extends from the imprint surface in a depth direction of the first surface is 600 nm or more.

* * * * *